(12) United States Patent
Kim et al.

(10) Patent No.: US 8,242,818 B2
(45) Date of Patent: Aug. 14, 2012

(54) PHASE-LOCKED LOOP FREQUENCY SYNTHESIZER

(75) Inventors: Helen H. Kim, Sudbury, MA (US);
Matthew D. Cross, Bedford, MA (US);
Merlin R. Green, Salem, MA (US);
Daniel D. Santiago, Waltham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/645,434

(22) Filed: Dec. 22, 2009

(65) Prior Publication Data

US 2011/0148484 A1    Jun. 23, 2011

(51) Int. Cl.
*H03L 7/06* (2006.01)
(52) U.S. Cl. ......... 327/156; 327/157; 327/148; 375/376
(58) Field of Classification Search .................. 327/156, 327/105, 147
See application file for complete search history.

(56) References Cited

U.S. PATENT DOCUMENTS

| | | | | |
|---|---|---|---|---|
| 5,144,254 A * | 9/1992 | Wilke | | 327/107 |
| 5,929,711 A * | 7/1999 | Ito | | 331/1 A |
| 5,982,210 A * | 11/1999 | Rogers | | 327/156 |
| 6,118,316 A * | 9/2000 | Tamamura et al. | | 327/156 |
| 6,228,583 B1 * | 5/2001 | Guarente et al. | | 435/6 |
| 6,788,155 B2 * | 9/2004 | Chaudhuri et al. | | 331/46 |
| 6,833,764 B1 * | 12/2004 | Dean | | 331/2 |
| 6,864,752 B2 * | 3/2005 | Caresosa et al. | | 331/16 |
| 6,922,110 B2 | 7/2005 | Ammar et al. | | |
| 6,977,537 B2 * | 12/2005 | Chaudhuri et al. | | 327/156 |
| 7,053,720 B2 * | 5/2006 | Caresosa et al. | | 331/16 |
| 7,324,789 B2 | 1/2008 | Jensen | | |
| 7,574,185 B2 * | 8/2009 | Ko | | 455/255 |
| 7,863,960 B2 * | 1/2011 | Wang et al. | | 327/291 |
| 2003/0112043 A1 * | 6/2003 | Takahashi | | 327/156 |
| 2004/0232996 A1 | 11/2004 | Ammar et al. | | |
| 2007/0018732 A1 | 1/2007 | Mattisson | | |

FOREIGN PATENT DOCUMENTS

WO    96-28890 A1    9/1996

OTHER PUBLICATIONS

Razavi, Behzad; "Challenges in the Design of Frequency Synthesizers for Wireless Applications"; IEEE 1997 Custom Integrated Circuits Conference; 8 pages.
Hafez, Amr N. et al.; "A Fully-Integrated Low Phase-Noise Nested-Loop PLL for Frequency Synthesis"; IEEE 2000 Custom Integrated Circuits Conference; 4 pages.
Razavi, Behzad; "RF Microelectronics"; Book; 1998; Chapter 8—Frequency Synthesizers; pp. 270-277 and pp. 284-285.
International Search Report for PCT/US2010/055397 dated Jun. 21, 2011; 9 pages.

* cited by examiner

*Primary Examiner* — Ryan Jager
(74) *Attorney, Agent, or Firm* — Guerin & Rodriguez, LLP; William G. Guerin

(57) ABSTRACT

Described is a frequency synthesizer having a wide output frequency range and small frequency tuning steps. In-band spurious components are maintained at low levels and phase noise is significantly reduced. The frequency synthesizer can be fabricated as an integrated circuit device having a small area and low power dissipation. The frequency synthesizer can be used in wideband frequency systems to reduce cost and size by replacing multiple frequency synthesizers each devoted to a portion of the overall system frequency range.

11 Claims, 5 Drawing Sheets

PHASE-LOCKED LOOP FREQUENCY SYNTHESIZER

GOVERNMENT RIGHTS IN THE INVENTION

This invention was made with U.S. Government support under grant number FA8721-05-C-0002, awarded by the Air Force. The government has certain rights in this invention.

FIELD OF THE INVENTION

The present invention relates generally to frequency synthesizers. More particularly, the invention relates to a frequency synthesizer having an ultra-wide tuning range and a small tuning step.

BACKGROUND OF THE INVENTION

Radio frequency (RF) systems employing frequency conversion utilize a tunable local oscillator to scan a wide input frequency range. A frequency synthesizer is often used for this purpose to generate a local oscillator signal having an accurate and stable frequency.

A significant problem exists when the frequency synthesizer is required to have a wide tuning range and a small tuning step while maintaining low phase noise and reference spurs. For example, spurious tones in the local oscillator signal of an RF receiver can appear in intermediate frequency (IF) signals or baseband signals after mixing the local oscillator signal with a received RF signal. Spurs within the system bandwidth typically cannot be filtered with a bandpass filter and therefore the spurs can limit the spur-free dynamic range (SFDR) of the RF receiver. Phase noise in the local oscillator signal can also degrade the RF system performance.

SUMMARY OF THE INVENTION

In one aspect, the invention features a frequency synthesizer that includes a first phase-locked loop that has a first loop bandwidth. The first phase-locked loop is configured to receive a source signal having a tunable frequency and to generate a reference signal having a frequency that is M times the tunable frequency of the source signal. The frequency synthesizer also includes a second phase-locked loop that has a second loop bandwidth that is greater than the first loop bandwidth. The second phase-locked loop is in communication with the first phase-locked loop to receive the reference signal and generates an output signal that has a frequency that is N times the frequency of the reference signal.

In another aspect, the invention features a method for synthesizing a frequency-tunable RF signal. A reference signal having a frequency that is M times a tunable frequency of a source signal is generated. The reference signal is phase locked to the source signal within a first loop bandwidth. An output signal having a frequency that is N times the frequency of the reference signal is generated. The output signal is phase locked to the reference signal within a second loop bandwidth that is greater than the first loop bandwidth.

In yet another aspect, the invention features a method for synthesizing a frequency-tunable RF signal. A first control signal is generated based on a phase comparison of a source signal and a frequency-divided reference signal. The control signal is filtered to produce a filtered first control signal having no frequency content outside a first loop bandwidth. A frequency of a reference signal is controlled in response to the filtered first control signal. A second control signal is generated based on a phase comparison of the reference signal and a frequency-divided output signal. The second control signal is filtered to produce a filtered second control signal having no frequency content outside a second loop bandwidth. A frequency of an output signal is controlled in response to the filtered second control signal.

BRIEF DESCRIPTION OF THE DRAWINGS

The above and further advantages of this invention may be better understood by referring to the following description in conjunction with the accompanying drawings, in which like numerals indicate like structural elements and features in the various figures. For clarity, not every element may be labeled in every figure. The drawings are not necessarily to scale, emphasis instead being placed upon illustrating the principles of the invention.

DETAILED DESCRIPTION

The invention relates to a frequency synthesizer having a wide frequency tuning range and a small tuning step. The frequency synthesizer has low phase noise and low spurious content. Advantageously, the frequency synthesizer can be implemented as an integrated circuit (e.g., using CMOS or BiCMOS fabrication processes) with low power requirements relative to conventional frequency synthesizers with similar performance requirements. Moreover, the frequency synthesizer can be used in wideband frequency systems to replace multiple frequency synthesizers each devoted to a portion of the overall frequency range of the system. Thus the cost and size of such wideband systems can be significantly reduced.

Figure 1A:
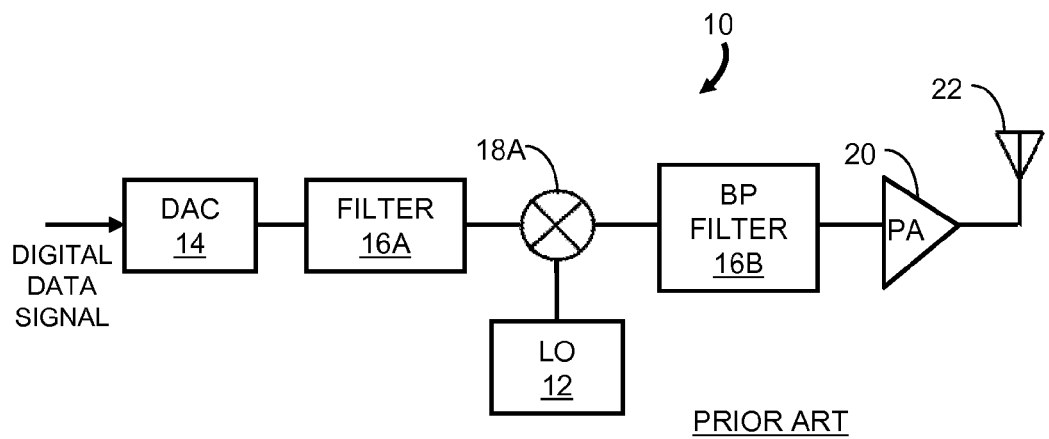
FIG. 1A and FIG. 1B are high level block diagrams of an RF transmitter and an RF receiver, respectively.
Figure 1B:
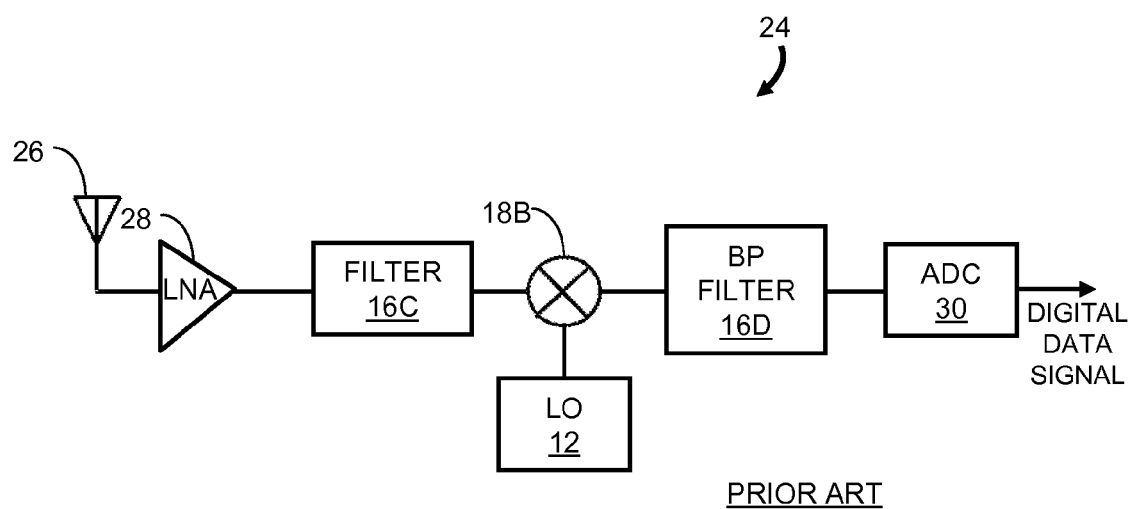

FIG. 1A is a high level block diagram of an RF transmitter 10 having a local oscillator (LO) 12 for up-conversion of an RF transmit signal. The transmitter 10 further includes a digital-to-analog converter (DAC) 14, filters 16A and 16B (generally 16), up-conversion mixer 18A, power amplifier (PA) 20 and transmit antenna 22. FIG. 1B is a block diagram of an RF receiver 24 having a local oscillator 12 for down-conversion of a received RF signal. The RF receiver 24 further includes a receiving element 26, low noise amplifier (LNA) 28, filters 16C and 16D, and analog-to-digital converter (ADC) 30. In either configuration the local oscillator signals can have spurious tones or "spurs" that degrade system performance. For example, if the spurs occur within the instantaneous bandwidth of the RF receiver 24, the spurs may be present in the IF signal or baseband signal after the down conversion mixer 18B. The phase noise of the local oscillator 12 is an additional source of signal degradation. A signal to be detected can be masked by the phase noise of a large transmit signal thus degrading the signal to noise ratio of the receiver.

Figure 2:
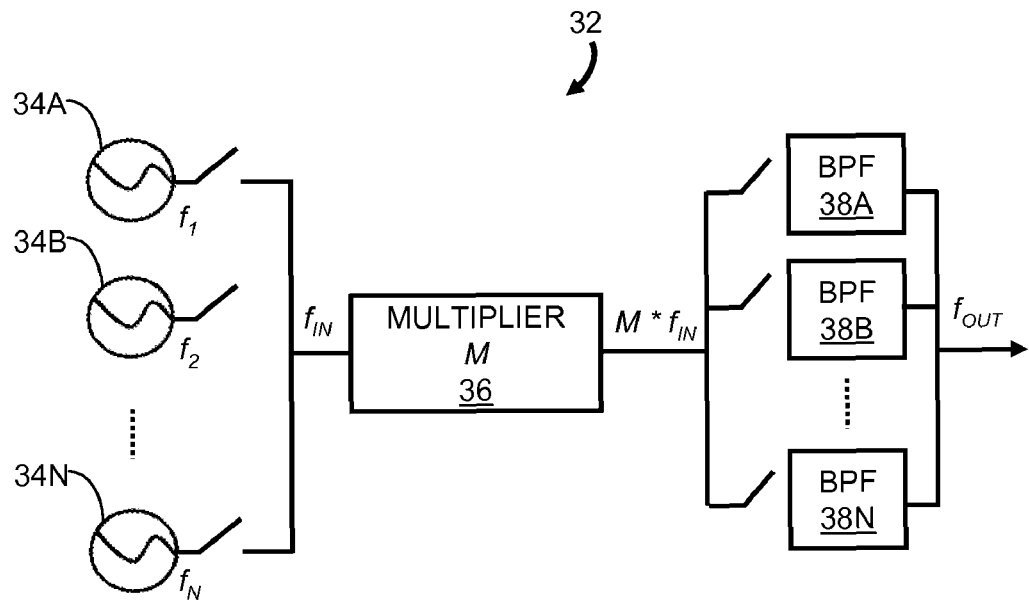
FIG. 2 is a block diagram of a conventional high performance frequency synthesizer according to a direct architecture.

FIG. 2 illustrates a conventional high performance frequency synthesizer 32 according to a direct architecture. A plurality of reference oscillators 34 are included. Each oscillator 34 has a unique frequency ($f_1, f_2, \ldots, f_N$) and is selected for coupling to one or more multipliers 36 by a switch. The frequency $f_{IN}$ of the selected oscillator 34 is multiplied by a multiplication ratio M to the desired output frequency $f_{OUT}$. A filter is chosen from a group of filters 38A to 38N to obtain the desired output frequency $f_{OUT}$. The phase noise of the selected oscillator 34 is also multiplied by the multiplication ratio M. The switch, multiplier 36 and filter 38 contribute to the noise in the output signal. Moreover, the need for multiple oscillators 34 and filters 38, and at least one multiplier 36 results in large size and power requirements (e.g., tens of watts).

To achieve a wide tuning range with a fine tuning step, the reference oscillators 34 can be replaced by a tunable frequency source such as a direct digital synthesizer (DDS). The source signal from the DDS is processed using an offset mixer or a multiplier to shift the frequency up to the desired output frequency $f_{OUT}$. Multiple filters 38 or a tunable filter with high selectivity are still required to cover the wide tuning range. As these alternative implementations are also based on discrete components, frequency synthesizers having this general configuration also have large size and power requirements.

Figure 3:
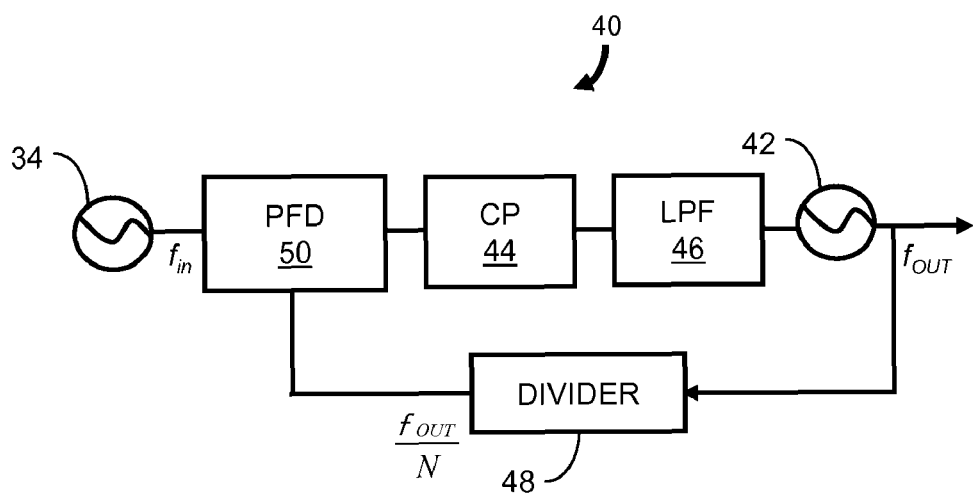
FIG. 3 is a block diagram of a frequency synthesizer based on a phase-locked loop architecture.

FIG. 3 shows a simplified block diagram of a frequency synthesizer 40 based on a basic phase-locked loop architecture. The frequency synthesizer 40 can be fabricated as an integrated circuit device having a substantially smaller size and reduced power consumption relative to the frequency synthesizer 32 fabricated with discrete components as shown in FIG. 2. A voltage controlled oscillator (VCO) 42 generates a signal having a frequency $f_{OUT}$ determined according to an output voltage of a charge pump (CP) 44 after filtering by a loop filter 46. The VCO signal is provided to a divider 48 that divides the frequency $f_{OUT}$ by a value N that can be a non-integer value. A phase frequency detector (PFD) 50 compares the phase and the frequency $$\frac{f_{OUT}}{N}$$

of the divided output signal to the frequency $f_{IN}$ of a reference oscillator 34 such as a crystal reference oscillator. The output signal from the phase frequency detector 50 is, in effect, a control signal that responds to the comparison and is used to control the charge pump 44. The charge pump voltage is filtered to remove higher frequency components and the filtered voltage is applied to the VCO 42 to maintain or tune (i.e., control) the output frequency $f_{OUT}$ to the desired value. More specifically, if the reference frequency $f_{IN}$ is greater than $$\frac{f_{OUT}}{N},$$

the charge pump 44 accumulates more charge at the loop filter 46, thereby increasing the voltage applied to the VCO 42 and the output frequency $f_{OUT}$. Conversely, if the reference frequency $f_{IN}$ is less than $$\frac{f_{OUT}}{N},$$

the charge pump 44 removes charge, thereby decreasing the voltage applied to the VCO 42 and the output frequency $f_{OUT}$. Thus the loop is locked at a synthesizer output frequency $f_{OUT}$ of $N*f_{IN}$ when the frequency and phase difference of the output signal from the divider 48 and the reference oscillator signal is maintained at zero.

The frequency synthesizer 40 implemented as an integrated circuit has a significant reduction in area and power requirements relative to the frequency synthesizer 32 of FIG. 2; however, the performance is generally not sufficient to meet the demanding requirements of ultra low phase noise and low spur contribution. In particular, low Q inductors and varactors pose a challenge to the design of a VCO with low phase noise; however, a large loop bandwidth can be used to suppress the phase noise of an integrated VCO with on-chip inductors and varactors. To maintain loop stability, the reference frequency $f_{IN}$ is preferably substantially greater (e.g., more than ten times greater) than the loop bandwidth. If N has an integer value, the output frequency step size must be an integer multiple of the reference frequency $f_{IN}$, thus the high value of the reference frequency $f_{IN}$ results in a large tuning step size. By using a fractional-N phase-locked loop, the constraint of a fixed integer step for frequency tuning is removed; however, the repeated switching of the divider value N during operation results in large in-band spurs. Although $\Sigma\Delta$ modulation can reduce the in-band spurs levels substantially, the noise floor increases. Thus a $\Sigma\Delta$ modulation technique may not be adequate to achieve both low spurious content and low phase noise required for high SFDR applications.

Figure 4:
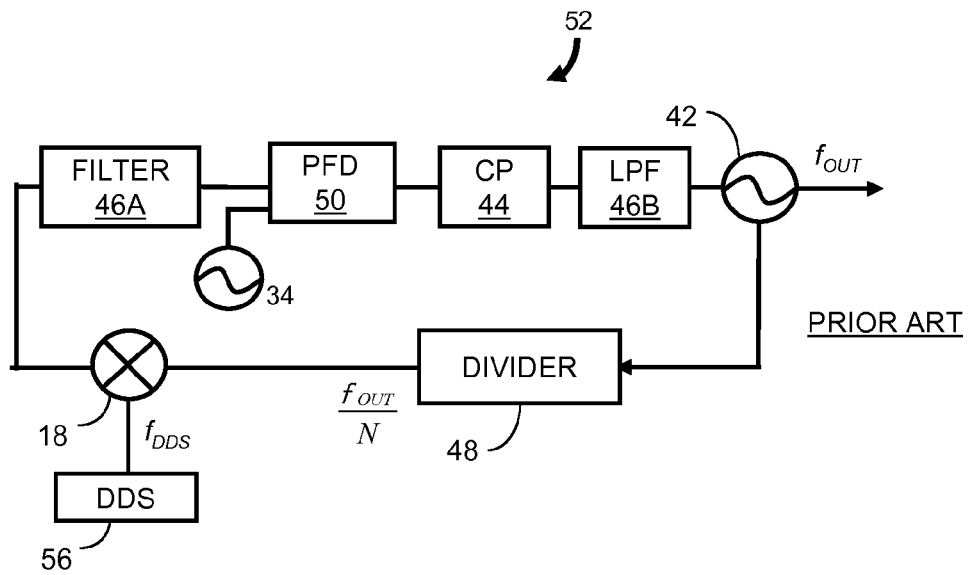
FIG. 4 is a block diagram illustrating a frequency synthesizer utilizing an offset mixer and a direct digital synthesizer within a phase-locked loop.
Figure 5:
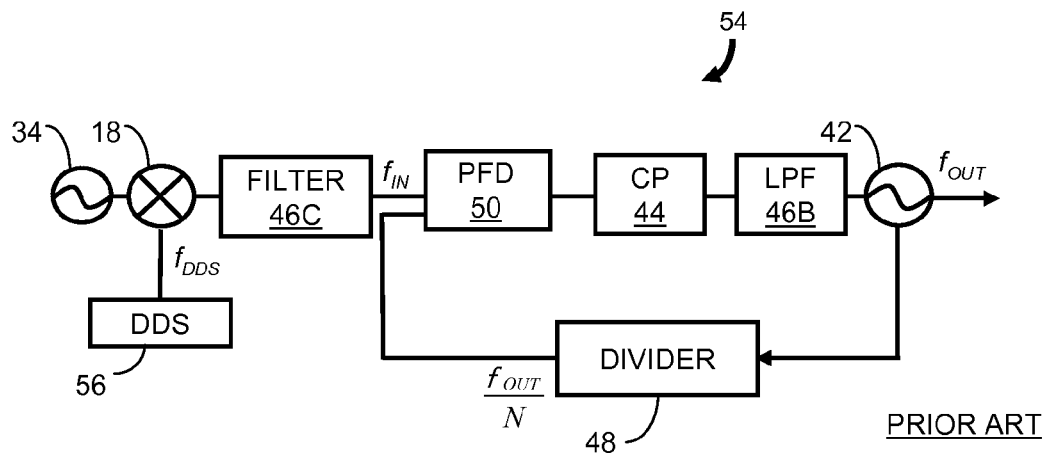
FIG. 5 is a block diagram illustrating a frequency synthesizer utilizing an offset mixer and a direct digital synthesizer external to a phase-locked loop.

FIG. 4 and FIG. 5 show frequency synthesizers 52 and 54, respectively, based on the use of an offset mixer 18 and a DDS 56. The offset mixer 18 and DDS 56 are inside the feedback loop in FIG. 4. In contrast, FIG. 5 shows the offset mixer 18 and DDS 56 outside the feedback loop.

Referring to FIG. 4, the divided output signal from the divider 48 and a source signal from the DDS 56 at a frequency $f_{DDS}$ are mixed. The mixer 18 generates a signal that includes the sum and difference frequencies of the DDS frequency $f_{DDS}$ and frequency $$\frac{f_{OUT}}{N}$$

of the divided output signal. A filter 46A selects one of the sum and difference frequencies to compare to the fixed reference frequency $f_{IN}$. The frequency synthesizer 52 has significant disadvantages. The filter 46A is required to have a sharp roll-off characteristic to pass one frequency while rejecting the other frequency. In addition, a means to initially lock the phase-locked loop is required. The necessary filter characteristic generally requires that significant size be available and can also result in appreciable loss. If the signal from the offset mixer 18 does not have a frequency that is passed by the filter 46A, the loop does not function properly. In this instance, a complicated control mechanism may be required to ensure that the loop is initiated correctly.

Referring to FIG. 5, initiating locking of the loop is achieved in a straightforward manner because the output of the offset mixer 18 can be made to pass through the filter 46C. The frequency $f_{IN}$ at the phase frequency detector 50 is variable through control of the DDS 56, therefore the output frequency $f_{OUT}$ has an arbitrary step size even though N may be limited to integer values. Again the filter 46C is required to have a sharp roll-off characteristic to eliminate the unwanted frequency from the offset mixer 18. Insufficient rejection of the unwanted frequency can falsely lock the loop or leak through the phase frequency detector 50 and charge pump 44 to generate undesirable in-band spurs within the tunable range of the frequency synthesizer 54.

Figure 6:
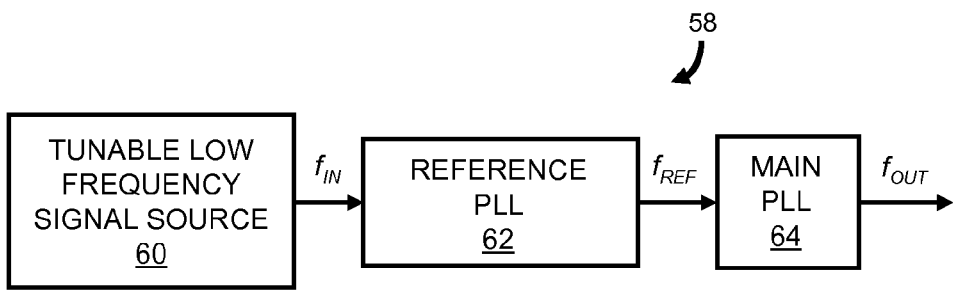
FIG. 6 is a high level block diagram of a frequency synthesizer according to an embodiment of the invention.

FIG. 6 shows a high level block diagram of an embodiment of a frequency synthesizer 58 according to the invention. The frequency synthesizer 58 includes a tunable low frequency signal source 60 to generate a source signal at a frequency $f_{IN}$, a first ("reference") phase-locked loop 62 that provides a signal at a frequency $f_{REF}$ and a second ("main") phase-locked loop 64 to generate a signal at the output frequency $f_{OUT}$. One or both of the phase-locked loops 62 and 64 can have an integer-N architecture to reduce the phase noise; however, this is not a requirement.

Figure 7:
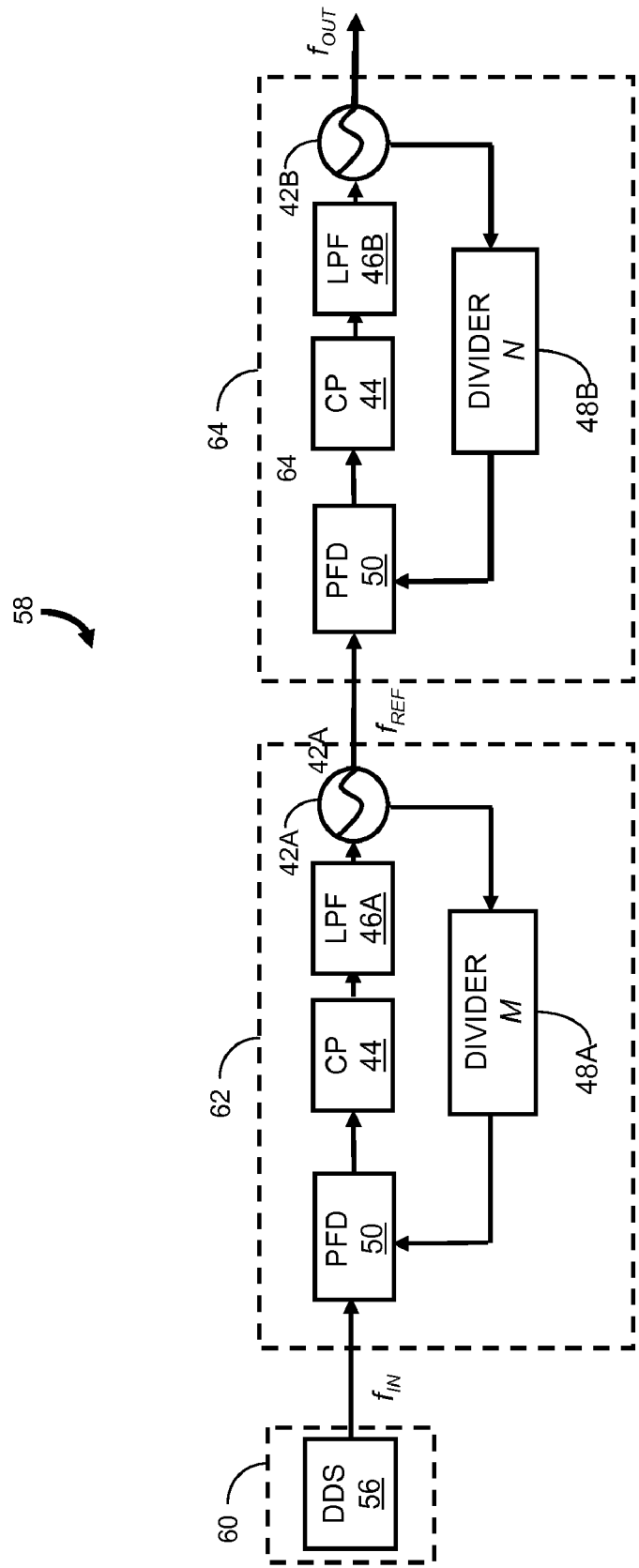
FIG. 7 is a block diagram showing the frequency synthesizer of FIG. 6 in more detail.

FIG. 7 is a block diagram showing the frequency synthesizer 58 of FIG. 6 in more detail. The low frequency signal source 60 is implemented as a DDS 56, and the reference and main phase-locked loops 62 and 64 have architectures similar to that of the phase-locked loop depicted in FIG. 3.

In the illustrated embodiment, the DDS 56 has a fine frequency step (e.g., less than 1 Hz). Consequently, the output frequency $f_{OUT}$ has small frequency tuning steps. High spur levels can occur if the DDS frequency $f_{IN}$ approaches one half of the clock frequency; however, the operating frequency range requirement of the DDS 56 in the illustrated embodiment is reduced in comparison with the other frequency synthesizer architectures described above. Consequently, the spur level is maintained at a low value over the relatively narrow operating frequency range of the DDS 56. In an exemplary embodiment, a commercially-available DDS (e.g., Model AD9912 Direct Digital Synthesizer available from Analog Devices of Norwood, Mass.) having a 14 bit digital-to-analog converter (DAC) has a spur level of less than −80 dBc over the limited operating frequency range.

Phase noise from each phase-locked loop 62 and 64 is primarily due to two contributions. The phase noise outside the loop bandwidth is dominated by the phase noise of the VCO 42 and the phase noise within the loop bandwidth is mainly due to the phase noise of the frequency source. The low input frequency $f_{IN}$ (e.g., on the order of 100 MHz) generated by the DDS 56 leads to a small loop bandwidth to be used with the reference phase-locked loop 62. The small loop bandwidth reduces leakage from the DDS 56 to the output of the reference VCO 42A. Preferably, the reference VCO 42A is selected to have a low phase noise characteristic. The higher reference frequency $f_{REF}$ applied to the second phase-locked loop 64 results in a higher loop bandwidth. By way of a specific example, the loop bandwidth of the first phase-locked loop 62 can be 100 kHz and the loop bandwidth of the second phase-locked loop 64 can be greater than 20 MHz. Consequently, the phase noise requirement for the main VCO 42B is less stringent that the phase noise requirement for the reference VCO 42A. Moreover, the contributions of noise from the other components in the second phase locked loop 64 are less because the divider value $N_B$ for the main phase locked loop 64 is small in comparison to the divider value NA for the reference phase locked loop 62. Moreover, any spurs generated in response to the reference frequency $f_{REF}$ are well outside the loop bandwidth.

By way of a numerical example, the frequency synthesizer 58 of FIG. 7 can be configured to generate a desired output frequency $f_{OUT}$ of 4.001 GHz. In this example, the divider 48B in the second phase-locked loop 64 has a divider value N of four. Thus the reference frequency $f_{REF}$ generated by the first phase-locked loop 62 is 1.00025 GHz. If the divider value M for the first phase-locked loop 62 is ten, the input frequency $f_{IN}$ generated by the DDS 56 is 100.025 MHz. The step size of the output frequency $f_{OUT}$ is determined by the step size capability of the DDS 56. Thus a DDS 56 having a step size of 1 Hz can provide for a step size for the output frequency $f_{OUT}$ of 40 Hz.

Although the embodiments described above relate to a frequency synthesizer having two phase-locked loops, the invention also contemplates a frequency synthesizer in which more than two phase-locked loops are configured in a serial arrangement, especially for applications in which the added complexity and increased power dissipation are overcome by performance increases.

In some applications a wide tuning range for the output frequency $f_{OUT}$ is desired. The VCO 42B of the main phase-locked loop 64 is often controlled via a tuning element, such as a varactor, to achieve a specific output frequency $f_{OUT}$. If a large change in the capacitance of the varactor is made to achieve a large change in frequency, the Q of the varactor can limit the performance of the VCO 42B.

Figure 8:
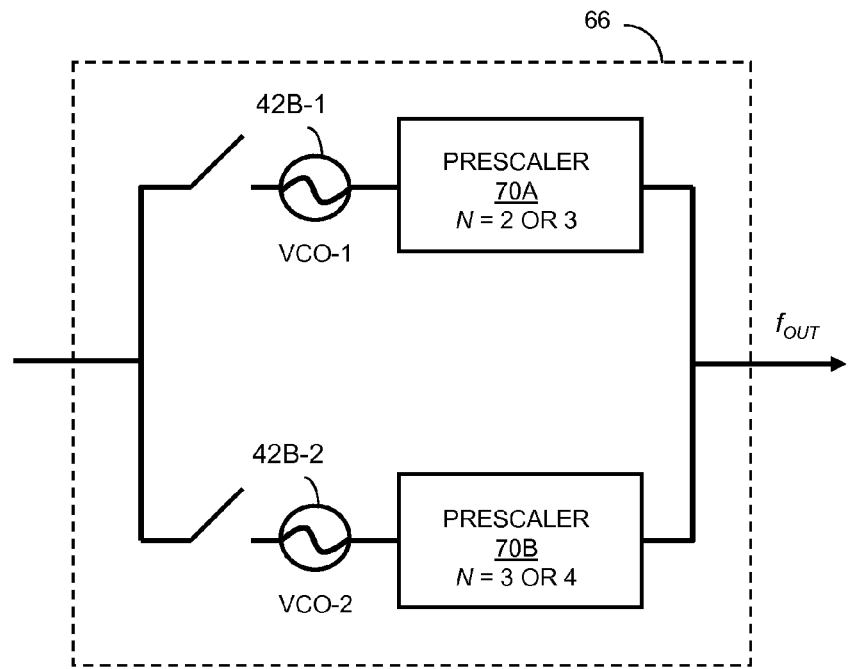
FIG. 8 is a block diagram showing a dual path configuration of voltage controlled oscillators and prescalers that can be used as a replacement for a single voltage controlled oscillator in FIG. 7 to obtain a greater operating frequency range according to another embodiment of the invention.

In a preferred embodiment, the VCO 42B of the second phase-locked loop 64 has a dual path configuration 66 as shown in FIG. 8 in which each path has a VCO (VCO-1 42B-1 and VCO-2 42B-2) operating over a different frequency range and each path includes a prescaler 70A or 70B having two selectable integer divider values N. The dual path configuration 66 allows the tuning range of each VCO 42B-1 and 42B-2 to be smaller than the tuning range of the single VCO 42B. The dual path VCO configuration 66 generally provides a wider useful output frequency range than is achievable when using a single VCO due to the lower phase noise contributions from the two VCOs 42B-1 and 42B-2.

Figure 9:
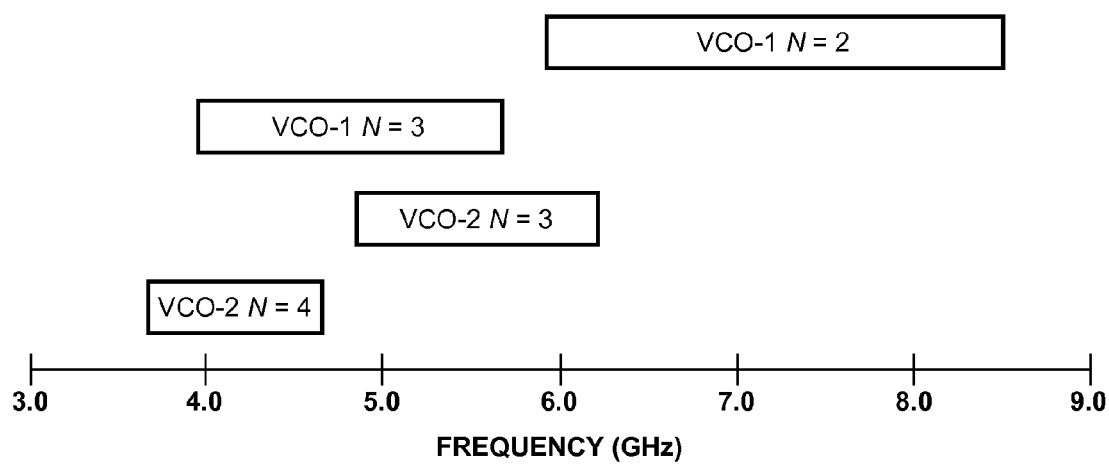
FIG. 9 graphically illustrates a numerical example showing four possible frequency ranges that can be achieved using the dual path configuration shown in FIG. 8.

FIG. 9 graphically illustrates four possible frequency ranges that can be realized according to a numerical example in which the VCO in the first path VCO-1 42B-1 operates over a frequency range of 11.8 GHz to 17.0 GHz and the VCO in the second path VCO-2 42B-2 operates over a frequency range of 14.5 GHz to 18.5 GHz. In the illustrated example, the first prescaler 70A has a selectable divider value N of 2 or 3 and the second prescaler 70B has a selectable divider value N of 3 or 4. The output frequency $f_{OUT}$ of the frequency synthesizer 58 extends from 3.6 GHz to 8.5 GHz.

It should be recognized that the dual path VCO configuration 66 of FIG. 8 can be modified to include more than two paths. Additional paths allow the VCO 42B in each path to operate over smaller frequency ranges thereby reducing the phase noise contribution of each VCO 42. Also, the prescaler dividers 70 can use more or less than two divider values as needed. Alternatively, or in combination, the additional paths can extend the full operating frequency range of the frequency synthesizer 58.

While the invention has been shown and described with reference to specific embodiments, it should be understood by those skilled in the art that various changes in form and detail may be made therein without departing from the spirit and scope of the invention.

What is claimed is:

1. A frequency synthesizer, comprising:
a first phase-locked loop having a first loop bandwidth, the first phase-locked loop configured to receive a source signal having a tunable frequency $f_{IN}$ and to generate a reference signal having a frequency $f_{REF}$ that is M times the tunable frequency $f_{IN}$ of the source signal; and
a second phase-locked loop having a second loop bandwidth and being in communication with the first phase-locked loop to receive the reference signal, the second phase-locked loop generating an output signal having a frequency $f_{OUT}$ that is N times the frequency $f_{REF}$ of the reference signal, wherein the first loop bandwidth is less than the second loop bandwidth, the second phase lock loop comprising:
a phase-frequency detector to receive the reference signal and a divided output signal, and to generate a control signal responsive to a difference in the frequency $f_{REF}$ of the reference signal and a frequency $$\frac{f_{OUT}}{N}$$

of the divided output signal wherein N is a divider value;
a charge pump in communication with the phase-frequency detector and configured to generate a voltage signal responsive to the control signal;
a filter in communication with the charge pump to filter the voltage signal according to the second loop bandwidth; and
a main voltage controlled oscillator (VCO) in communication with the filter, the main VCO generating the output signal in response to the filtered voltage signal, wherein the frequency $f_{OUT}$ of the output signal is responsive to a difference in the frequency $f_{REF}$ of the reference signal and the frequency $$\frac{f_{OUT}}{N}$$

of the divided output signal and wherein the main VCO comprises a first path having a first VCO in serial communication with a first prescaler and a second path having a second VCO in serial communication with a second prescaler, the first and second VCOs having different operating frequency ranges and the first and second prescalers each having at least one divider value, wherein the frequency $f_{OUT}$ of the output signal is determined by a selection of one of the paths and a divider value for the prescaler in the selected path.

2. The frequency synthesizer of claim 1 wherein the first phase-locked loop and the second phase-locked loop are fabricated in a single integrated circuit.

3. The frequency synthesizer of claim 1 further comprising a signal source in communication with the first phase-locked loop to generate the source signal having the tunable frequency $f_{IN}$.

4. The frequency synthesizer of claim 3 wherein the first phase-locked loop, the second phase-locked loop and the signal source are fabricated in a single integrated circuit.

5. The frequency synthesizer of claim 3 wherein the signal source is a direct digital synthesizer.

6. The frequency synthesizer of claim 3 wherein a maximum frequency of the frequency $f_{OUT}$ of the output signal is at least twice a minimum frequency of the frequency $f_{OUT}$ of the output signal.

7. The frequency synthesizer of claim 1 wherein M is greater than N.

8. The frequency synthesizer of claim 1 wherein M and N are integer values.

9. The frequency synthesizer of claim 1 wherein the first phase-locked loop comprises:
a phase-frequency detector to receive the source signal and a divided reference signal, and to generate a control signal responsive to a difference in the tunable frequency $f_{IN}$ and a frequency $$\frac{f_{REF}}{M}$$

of the divided reference signal wherein M is a divider value;
a charge pump in communication with the phase-frequency detector and configured to generate a voltage signal responsive to the control signal;
a filter in communication with the charge pump to filter the voltage signal according to the first loop bandwidth; and
a reference voltage controlled oscillator (VCO) in communication with the filter, the reference VCO generating the reference signal in response to the filtered voltage signal, wherein the frequency $f_{REF}$ of the reference signal is responsive to a difference in the tunable frequency $f_{IN}$ and the frequency $$\frac{f_{REF}}{M}$$

of the divided reference signal.

10. The frequency synthesizer of claim 9 further comprising a divider applying the divider value M and being in communication with the reference VCO and the phase-frequency detector, the divider receiving the reference signal and generating the divided reference signal in response thereto.

11. The frequency synthesizer of claim 1 further comprising a divider applying the divider value N and being in communication with the main VCO and the phase-frequency detector, the divider receiving the output signal and generating the divided output signal in response thereto.

* * * * *